United States Patent
Kiyota et al.

(10) Patent No.: US 10,415,794 B2
(45) Date of Patent: Sep. 17, 2019

(54) LIGHT EMITTING DEVICE

(71) Applicant: NICHIA CORPORATION, Anan-shi, Tokushima (JP)

(72) Inventors: Seiji Kiyota, Tokushima (JP); Hiroaki Yuto, Awa (JP); Kei Adachi, Tokyo (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/473,524

(22) Filed: Mar. 29, 2017

(65) Prior Publication Data
US 2017/0284634 A1   Oct. 5, 2017

(30) Foreign Application Priority Data

Mar. 31, 2016 (JP) ................................. 2016-073319
Dec. 5, 2016 (JP) ................................. 2016-235543

(51) Int. Cl.
*F21V 21/26* (2006.01)
*F21V 9/30* (2018.01)
(Continued)

(52) U.S. Cl.
CPC ................ *F21V 9/30* (2018.02); *F21S 41/14* (2018.01); *F21S 41/16* (2018.01); *F21S 43/26* (2018.01);
(Continued)

(58) Field of Classification Search
CPC .... F21K 9/00; F21K 9/64; F21S 41/14; F21S 41/141; F21S 41/147; F21S 41/148;
(Continued)

(56) References Cited

U.S. PATENT DOCUMENTS

2010/0246159 A1   9/2010 Wada
2012/0039072 A1   2/2012 Lell et al.
(Continued)

FOREIGN PATENT DOCUMENTS

DE   102008063634 A1   6/2010
DE   102014226336 A1   6/2016
(Continued)

OTHER PUBLICATIONS

Extended European Search Report for European Patent Application No. 17163629.3 dated Aug. 1, 2017.

*Primary Examiner* — Jason M Han
(74) *Attorney, Agent, or Firm* — Foley & Lardner LLP

(57) ABSTRACT

A light emitting device includes: a base member; a laser element disposed on or above a mounting surface of the base member; a fluorescent member including a first main surface and a second main surface respectively positioned on opposite sides of the fluorescent member, the second main surface being fixed to the mounting surface of the base member; a first optical member configured to change a traveling direction of laser light emitted by the laser element to be directed toward the first main surface of the fluorescent member; and a lid connected to the base member and enclosing the laser element, the fluorescent member, and the first optical member in a space beneath the lid, the lid being configured to transmit light from the fluorescent member.

31 Claims, 3 Drawing Sheets

(51) Int. Cl.
*F21V 5/02* (2006.01)
*F21V 5/04* (2006.01)
*F21V 11/00* (2015.01)
*F21V 31/00* (2006.01)
*H01S 5/00* (2006.01)
*F21S 41/14* (2018.01)
*F21S 43/20* (2018.01)
*F21S 41/16* (2018.01)
*F21Y 115/30* (2016.01)
*H01S 5/022* (2006.01)
*H01S 5/323* (2006.01)
*F21K 9/64* (2016.01)

(52) U.S. Cl.
CPC ............... *F21V 5/02* (2013.01); *F21V 5/04* (2013.01); *F21V 11/00* (2013.01); *F21V 31/005* (2013.01); *H01S 5/005* (2013.01); *F21K 9/64* (2016.08); *F21Y 2115/30* (2016.08); *H01S 5/0222* (2013.01); *H01S 5/0224* (2013.01); *H01S 5/02216* (2013.01); *H01S 5/02292* (2013.01); *H01S 5/02296* (2013.01); *H01S 5/32341* (2013.01)

(58) Field of Classification Search
CPC .. F21S 41/16; F21S 41/20; F21S 41/25; F21S 41/285; F21S 43/26; F21V 5/008; F21V 5/02; F21V 5/04; F21V 9/30; F21V 9/32; F21V 9/35; F21V 11/00; F21V 31/005; F21Y 2115/30; H01S 5/005; H01S 5/022; H01S 5/02208; H01S 5/02216; H01S 5/0224; H01S 5/02292; H01S 5/02296; H01S 5/32341
USPC ............... 362/249.02, 272, 311.02, 800
See application file for complete search history.

(56) References Cited

U.S. PATENT DOCUMENTS

| | | |
|---|---|---|
| 2012/0320583 A1 | 12/2012 | Van Bommel et al. |
| 2013/0314937 A1 | 11/2013 | Takahashi et al. |
| 2013/0329397 A1 | 12/2013 | Shimizu et al. |
| 2015/0308644 A1* | 10/2015 | Takahashi ............ F21S 48/125 362/538 |
| 2015/0357790 A1 | 12/2015 | Jeoung et al. |

FOREIGN PATENT DOCUMENTS

| | | |
|---|---|---|
| EP | 2672178 A2 | 12/2013 |
| EP | 3 291 386 A1 | 3/2018 |
| JP | 2010-251686 A | 11/2010 |
| JP | 2013-016567 A | 1/2013 |
| JP | 2013-254889 A | 12/2013 |
| WO | WO 2016/035435 A1 | 3/2016 |

* cited by examiner

LIGHT EMITTING DEVICE

CROSS-REFERENCE TO RELATED PATENT APPLICATIONS

This application claims priority to Japanese Patent Applications No. 2016-073319, filed on Mar. 31, 2016, and No. 2016-235543, filed on Dec. 5, 2016, the disclosures of which are hereby incorporated herein by reference in their entireties.

BACKGROUND

The present disclosure relates to a light emitting device.

There has been known a light emitting device that includes a base member, a laser element and a fluorescent member provided on the base member. Laser light from the laser element is caused to enter the fluorescent member from its lateral surface or its upper surface, and is extracted from the upper surface of the fluorescent member (for example, see JP 2010-251686 A and JP 2013-16567 A).

SUMMARY

However, for example, the light emitting device disclosed in JP 2010-251686 A is poor in light extraction efficiency because the laser light enters the fluorescent member from the lateral surface and is extracted from the upper surface thereof. That is, the light entering the fluorescent member from the lateral surface thereof is absorbed and scattered inside the fluorescent member before the light is extracted from the upper surface of the fluorescent member. Thus, the light use efficiency is disadvantageously reduced.

In the light emitting device disclosed in JP 2013-16567 A, in order to cause the laser light to enter the fluorescent member from its upper surface and to extract the light from the identical surface, the laser element is mounted on an inclined surface of the base member positioned at a higher position than the upper surface of the fluorescent member. In this case, it is difficult for a heat sink connected to the lower surface of the light emitting device to efficiently release heat generated by the laser element, because of a relatively large distance between the laser element and the heat sink. Further, the requirement that the inclined surface of the base member must be formed at a position higher than the upper surface of the fluorescent member tends to increase the size of the light emitting device. Further, the inclination of the surface on which the laser element is mounted hinders precise mounting of the laser element.

In one embodiment of the present disclosure, a light emitting device includes: a base member; a laser element disposed on or above a mounting surface of the base member; a fluorescent member including a first main surface and a second main surface respectively positioned on opposite sides of the fluorescent member, the second main surface being fixed to the mounting surface of the base member; a first optical member configured to change a traveling direction of laser light emitted by the laser element to be directed toward the first main surface of the fluorescent member; and a lid connected to the base member and enclosing the laser element, the fluorescent member, and the first optical member in a space beneath the lid, the lid being configured to transmit light from the fluorescent member.

The light emitting device described above can achieve miniaturization, high luminance, and improved heat releasing property.

DETAILED DESCRIPTION OF EMBODIMENTS

Figure 1:
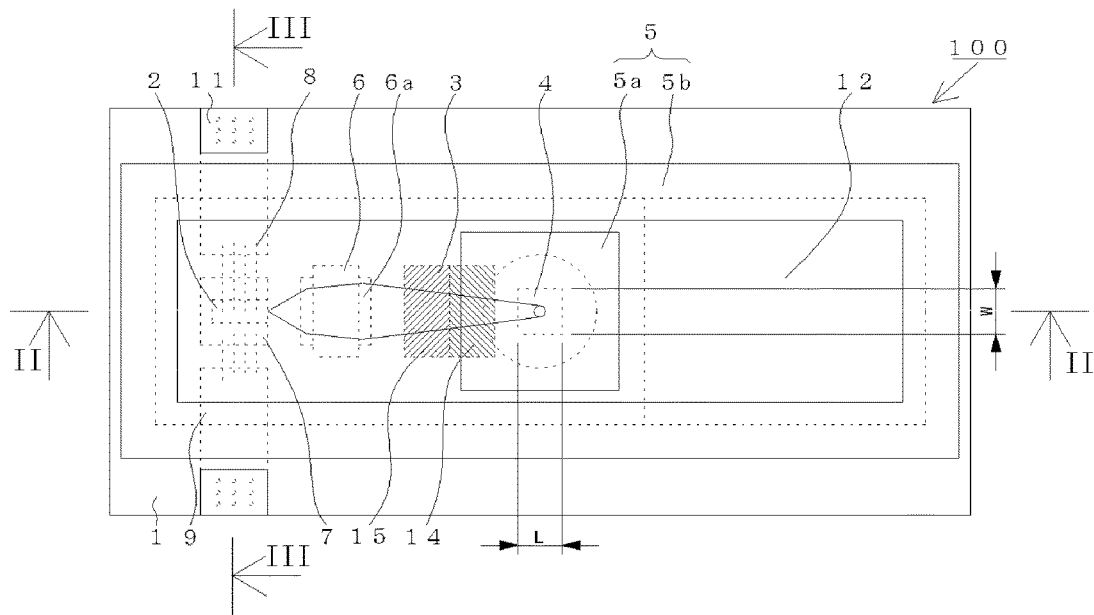
FIG. 1 is a schematic plan view of a light emitting device according to a first embodiment.

In the following, a description will be given of embodiments of the present invention with reference to the drawings. Note that, the following embodiments are provided for illustrating the structure for embodying the technical idea of the present invention, and not intended to specify the present invention. In the following description, identical or similar members are denoted by identical names or reference characters, and detailed descriptions thereof are omitted as appropriate.

First Embodiment

Figure 2:
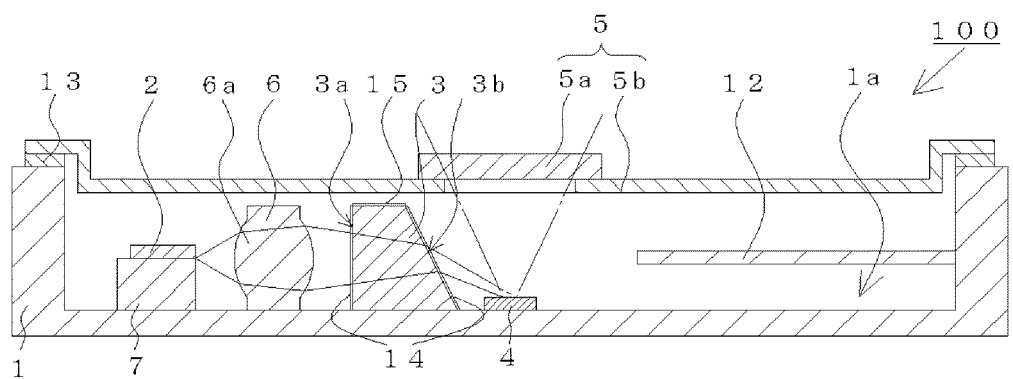
FIG. 2 is a cross-sectional view taken along line II-II in FIG. 1.
Figure 3:
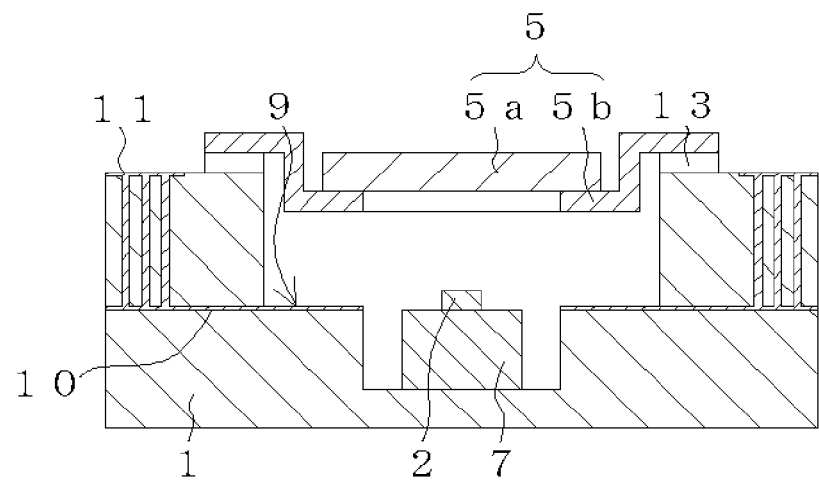
FIG. 3 is a cross-sectional view taken along line in FIG. 1.

As shown in FIGS. 1 to 3, in a light emitting device 100 according to the first embodiment, a laser element 2 is disposed above the mounting surface of a base member 1. A fluorescent member 4, which includes a first main surface and a second main surface respectively provided on the opposite sides of the fluorescent member 4, has its second main surface fixed to the mounting surface of the base member 1. A first optical member 3 is disposed so as to change the traveling direction of laser light emitted by the laser element 2 to be directed toward the first main surface of the fluorescent member 4. Here, a lid 5 that transmits light from the fluorescent member 4 is employed. The lid 5 is connected to the base member 1 so as to enclose the laser element 2, the fluorescent member 4, and the first optical member 3 in a space beneath the lid 5.

As shown in FIG. 2, in the light emitting device 100, the traveling direction of the laser light emitted by the laser element 2 is changed by the first optical member 3, and becomes incident on the first main surface of the fluorescent member 4 from a point diagonally above the first main surface. In the present embodiment, the first optical member 3 is a prism. The fluorescent member 4 is excited by the incident laser light, and emits light which is different in wavelength from the laser light. This wavelength converted light is mainly emitted upward from the first main surface. Then, the wavelength converted light and part of the reflected light which is reflected without exciting the fluorescent member 4 transmit through the lid 5 and extracted to the outside of the light emitting device 100. Thus, light, for example white-color light, can be extracted from the upper surface of the light emitting device 100. As used herein, the upper surface of the light emitting device 100 refers to the surface from which light is extracted. In other words, the upper surface is the surface provided with the lid 5. In the case where the light emitted by the light emitting device 100 white-color light, the laser light may be blue-color light and the wavelength converted light may be yellow-color light.

Note that part of the reflected light travels inside the base member 1 without transmitting through the lid 5.

The first optical member 3 is configured to change the traveling direction of the laser light. Accordingly, even when the laser element 2 emits laser light in the direction substantially parallel to the mounting surface of the base member 1, that is, in the direction passing above the fluorescent member 4, the first optical member 3 can cause the laser light to become incident on the first main surface of the fluorescent member 4 from a point diagonally above the first main surface. Thus, as compared to the case where no first optical member 3 is employed, and for example, the surface where the laser element 2 is disposed is inclined, the base member 1 can be reduced in height and consequently the light emitting device 100 can be miniaturized. Further, when the light emitting device 100 has its lower surface connected to a heat sink, the distance between the laser element 2 and the heat sink can be shortened. This allows heat to be efficiently released.

Because the laser light becomes incident on the first main surface of the fluorescent member 4 from a point diagonally above the first main surface, the surface of the fluorescent member 4 and regions near the surface of the fluorescent member 4 mainly emit light, rather than the inside of the fluorescent member 4. Positioned above the fluorescent member 4 is the light extraction surface of the light emitting device 100. Thus, as compared to the case where the first main surface of the fluorescent member 4 on which the laser light becomes incident and the light extraction surface of the light emitting device 100 do not face the same side, the light extraction efficiency of the light emitting device 100 can be improved and luminance can be increased. Further, because the laser light mainly excites the surface of the fluorescent member 4 and regions near the surface of the fluorescent member 4, as compared to the case where the laser light becomes incident on one surface of the fluorescent member 4 and is extracted from another surface of the fluorescent member 4, the fluorescent member 4 can be reduced in thickness. Consequently, the light emitting device 100 can be miniaturized.

The members are described in detail below.

Laser Element 2

While the laser element 2 may be laser elements of any kind and in any number, in the light emitting device 100, the laser element 2 is a single GaN-based semiconductor laser element. The oscillation wavelength of the GaN-based semiconductor laser element may be, for example, 350 nm to 600 nm, preferably 430 nm to 460 nm. Further, the output of the laser element 2 may be, for example, 2 W to 4 W.

The laser element 2 is preferably junction-down mounted on the mounting surface of the base member 1. As used herein, the laser element 2 being junction-down mounted means that the main surface of the laser element 2 closer to the active layer is mounted on the mounting surface of the base member 1. For example, the laser element 2 is mounted so that the active layer thereof is positioned at a lower level than half the thickness of the laser element 2. This allows heat of the laser element 2 to be efficiently released to the base member 1.

As shown in FIG. 2, in the light emitting device 100, a submount 7 is disposed on the mounting surface of the base member 1, and the laser element 2 is disposed on the submount 7. Thus, as compared to the case where the laser element 2 is directly disposed on the mounting surface of the base member 1, the light exiting surface of the laser element 2 can be distanced from the mounting surface of the base member 1. This reduces the possibility of the laser light becoming incident on the mounting surface of the base member 1, and facilitates the laser light to become incident on the first main surface of the fluorescent member 4 from a point diagonally above the first main surface. The submount 7 may be made of, for example, aluminum nitride, silicon carbide or the like. In the light emitting device 100 according to the present embodiment, the submount 7 is made of silicon carbide, which exhibits high thermal conductivity. The submount 7 may have a thickness of, for example, 0.2 mm to 0.5 mm. Note that the laser element 2 may be directly disposed on the mounting surface of the base member 1.

First Optical Member 3

The first optical member 3 is configured to change the traveling direction of laser light. The first optical member 3 is preferably a prism that has a light entering surface 3a from which the laser light enters and a light exiting surface 3b from which the laser light exits. The prism is a transparent polyhedron, and may be made of an inorganic material such as quartz, glass or sapphire. As shown in FIG. 2, in the light emitting device 100, the first optical member 3 is formed by polygonal columnar glass, and has one of its surface mounted on the mounting surface of the base member 1. Further, the first optical member 3 does not contain a fluorescent material or filler. The first optical member 3 is configured to change the traveling direction of light by causing the light to be refracted, totally reflected and/or double-refracted. Accordingly, with the first optical member 3, the traveling direction of the laser light can be easily changed to be directed toward the first main surface of the fluorescent member 4.

When the first optical member 3 is disposed between the laser element 2 and the fluorescent member 4 as seen in a top view, preferably the bottom surface of the first optical member 3 and the light exiting surface 3b of the first optical member 3 form an acute angle. In the light emitting device 100, while the angle of the first optical member 3 is 55 degrees, it may be 50 degrees to 70 degrees, for example. Such angles can downwardly refract the laser light entering the first optical member 3, so that the laser light exits from the light exiting surface 3b toward the first main surface of the fluorescent member 4. Further, the angle falling within such a range suppresses the light upwardly emitted from the excited fluorescent member 4 from becoming incident on the first optical member 3. This reduces the possibility of part of the light becoming incident on the first optical member 3 and creating a shade, and consequently reduces the possibility of a reduction in the light extraction efficiency. Further, the laser light is allowed to become incident on the fluorescent member 4 by a relatively short distance from the laser element 2. This suppresses a reduction in use efficiency of the laser light. Further, this also reduces any influence on the laser light due to any displacement of the members. Furthermore, this allows the laser light to become incident on the fluorescent member 4 by a short distance, allowing miniaturization of the light emitting device 100.

As shown in FIG. 1, the first optical member 3 is preferably disposed at a position to not overlap the fluorescent member 4 as seen in a top view. Such disposition reduces the possibility of part of the light, which is upwardly emitted from the excited fluorescent member 4, becoming incident on the first optical member 3 and creating a shade. That is, such disposition causes the light from the fluorescent member 4 to become less prone to becoming incident on the first optical member 3, and consequently reduces the possibility of a reduction in the light extraction efficiency.

In the case where the first optical member 3 is disposed between the laser element 2 and the fluorescent member 4, as shown in FIGS. 1 and 2, the first optical member 3 has its light entering surface 3a and its light exiting surface 3b preferably provided with an AR (anti-reflective) coating 14. The AR coating 14 improves the transmittance for the laser light, and therefore the efficiency of the light entering and exiting the first optical member 3 improves.

The upper surface of the first optical member 3 is preferably flat, so that the upper surface can be vacuum-suctioned for the first optical member 3 to be mounted on the mounting surface of the base member 1. Further, as shown in FIGS. 1 and 2, preferably a light shielding film 15 is deposited on the upper surface of the first optical member 3. The light shielding film 15 can reduce stray light. That is, there may be the case where part of the laser light entering the first optical member 3 exits the first optical member 3 from the upper surface thereof, and thereafter transmits through the lid 5 and extracted to the outside. Providing of the light shielding film 15 can reduce the possibility of such light extraction. Specifically, each side of the upper surface of the first optical member 3 may have a width of 0.3 mm to 0.8 mm. Further, the upper surface of the first optical member 3 may have an area of $0.2 \text{ mm}^2$ to $1.6 \text{ mm}^2$. Further, preferably the bottom surface of the first optical member 3 is metallized with Au, so that the bottom surface of the first optical member 3 and the Au metallized surface of the mounting surface of the base member 1 can be joined to each other with a joining member such as Au nanoparticles or Au—Sn.

Preferably, the light entering surface 3a of the first optical member 3 is substantially perpendicular relative to the optical axis of the entering laser light. Employing such a structure facilitates manufacture of the first optical member 3.

With the light emitting device 100, adjusting of the mounting position of the first optical member 3 facilitates correction of any deviation in height of the laser element 2 and/or a second optical member 6 from the design value. That is, firstly, the laser element 2 and the second optical member 6 are fixed to the base member 1. With the first optical member 3 being tentatively disposed so as to be shiftable, disposition of the first optical member 3 on the base member 1 is adjusted along a straight line connecting between the laser element 2 and the second optical member 6 and the fluorescent member 4. At this time, the laser element 2 is energized to laser. With the laser light being monitored, the position of the first optical member 3 is adjusted so that the laser light becomes incident on a predetermined position, and the first optical member 3 is positioned and fixed. In this manner, any deviation in height of the laser element 2 and/or the second optical member 6 from the design value can be corrected so that the laser light becomes incident on the first main surface of the fluorescent member 4. Accordingly, the first optical member 3 can be disposed so that the laser light travels through a course with a smaller reduction in the use efficiency of the laser light. Note that, while the second optical member 6 may be omitted, the second optical member 6 is preferably disposed.

Figure 4:
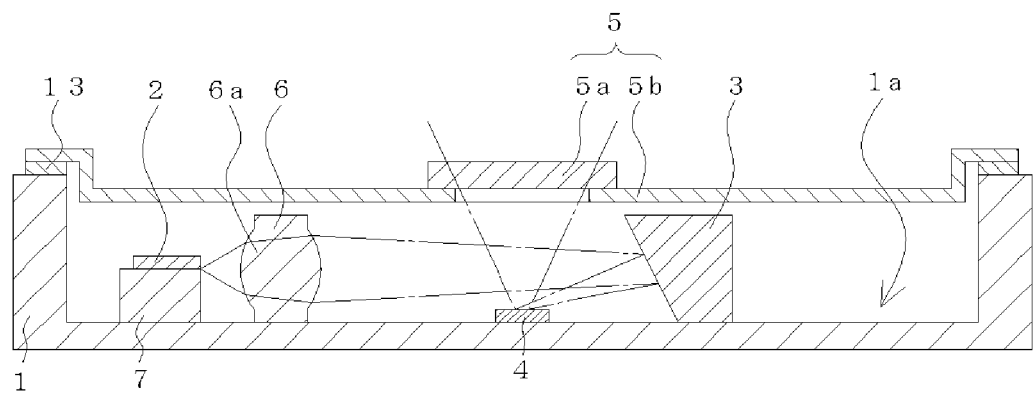
FIG. 4 is a schematic cross-sectional view of Variation of the light emitting device according to the first embodiment.
Figure 5:
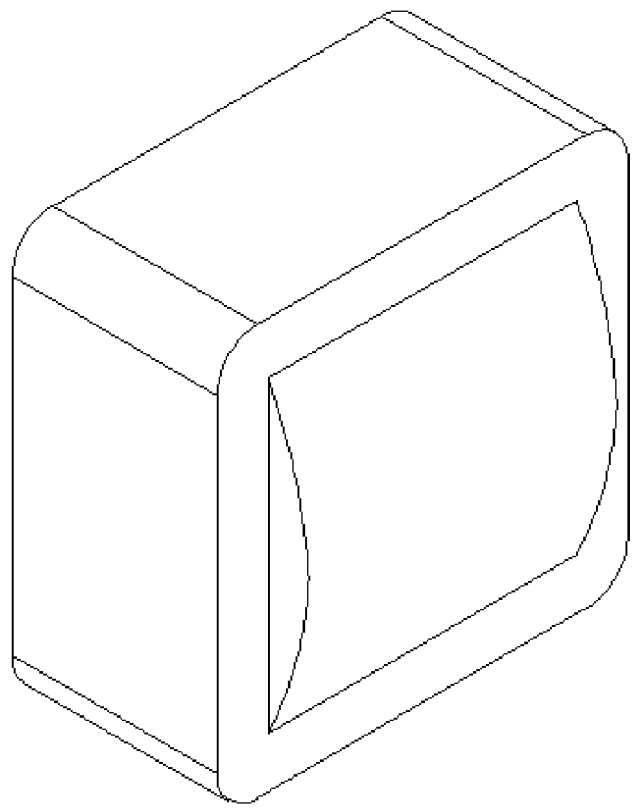
FIG. 5 is a schematic perspective view of a cylindrical lens according to the first embodiment.

As shown in FIG. 4, as seen in a top view, the laser element 2, the fluorescent member 4, and the first optical member 3 can be disposed linearly and in this order on the mounting surface of the base member 1. In this case, the laser light passes above the fluorescent member 4 and becomes incident on the first optical member 3. Then the laser light is reflected by the first optical member 3, and becomes incident on the fluorescent member 4. On the other hand, as in the light emitting device 100 shown in FIG. 1 and others, disposing the laser element 2, the first optical member 3, and the fluorescent member 4 linearly and in this order on the mounting surface of the base member 1 allows the laser light to become incident on the fluorescent member 4 by a relatively short distance from the laser element 2. This can achieve miniaturization of the light emitting device 100.

Second Optical Member 6

Preferably, the second optical member 6 is disposed between the laser element 2 and the first optical member 3. As shown in FIGS. 1 and 2, in the light emitting device 100, the second optical member 6 includes a frame which is rectangular parallelepiped-shaped and a lens 6a. The lens 6a projects from the rectangular parallelepiped-shaped frame. Preferably, the lens 6a condenses or collimates the laser light. As a result, out of the laser light emitted by the laser element 2, light having been traveling in the direction not leading to the first optical member 3 is condensed or collimated, and allowed to enter the first optical member 3. As a result, a reduction in use efficiency of the laser light can be suppressed. Further, in the case where the submount 7 is disposed under the laser element 2, the submount 7 can be reduced in thickness. That is, the lens 6a reduces the necessity for the submount 7 to have a greater thickness, which is otherwise necessary for raising the light emission point of the laser element 2 to cause the light traveling in the direction leading below the first optical member 3 to enter the first optical member 3, thus the submount 7 can be reduced in thickness. As a result, heat generated by the laser element 2 can be efficiently released to the base member 1, allowing the light emitting device 100 to be reduced in thickness.

Preferably, the lens 6a is a cylindrical lens of which lens curvature is provided in the direction where the angle of divergence of the laser light is greater. Such a cylindrical lens may be, for example, the lens 6a shown in FIG. 4. Such a lens 6a can condense, out of the laser light, light that diverges in the vertical direction while traveling. That is, the laser light emitted by the semiconductor laser element normally has a nature of diverging in the vertical direction while traveling, as compared to the horizontal direction. Therefore, the lens 6a can efficiently condense the laser light to enter the first optical member 3. Here, the horizontal direction is the direction that is parallel to the main surface of the laser element 2, and the vertical direction is the direction that is perpendicular thereto. Further, because laser light that diverges in the horizontal direction while traveling is not condensed, even when the course of the laser light deviates in the horizontal direction from the design value, the influence on the laser light due to any displacement of the second optical member 6 can be reduced. In the light emitting device 100, the cylindrical lens is disposed at the center of the rectangular parallelepiped-shaped frame. Such disposition facilitates not only matching between the optical axis of the cylindrical lens and the optical axis of the laser light, but also facilitates mounting of the second optical member 6 on the mounting surface of the base member 1. Further, the lens being the rectangular parallelepiped-shaped reduces the possibility of inclination of the cylindrical lens.

The curved surface of the lens 6a may be aspherical or spherical. Further, the light entering surface of the lens 6a may be a flat surface. The curved surface of the lens 6a is preferably provided with AR coating.

The upper surface of the second optical member 6 is preferably flat, so that the upper surface can be vacuum-suctioned for the second optical member 6 to be mounted on the mounting surface of the base member 1. Further, preferably the lower surface of the second optical member 6 is metallized with Au, so that the lower surface of the second optical member 6 and the Au metallized surface of the mounting surface of the base member 1 can be joined to each other with a joining member such as Au nanoparticles or Au—Sn.

Fluorescent Member 4

The fluorescent member 4 contains a fluorescent material. The fluorescent member 4 may be obtained by sintering a fluorescent material itself, or may be obtained by sintering a fluorescent material mixed with a sintering aid.

Preferably, the fluorescent member 4 emits fluorescence which provides, when used with the laser element 2, white-color light. Thus, the light emitting device 100 can be used as a light source such as a vehicular headlamp and other lighting. For example, in the case where the laser element 2 emits blue-color light, a fluorescent material that provides yellow-color light by being excited by the light emitted by the laser element 2 may be employed. The fluorescent material that emits yellow-color light may be a YAG-based fluorescent material. Further, in the case where the laser element 2 emits light which is shorter in wavelength than blue-color light (for example, ultraviolet light), fluorescent material that emits blue, green, and red fluorescence respectively can be employed.

In the case where a sintering aid is used, the sintering aid may be silicon oxide or aluminum oxide. Among others, aluminum oxide is particularly preferable. This is because aluminum oxide has a high melting point, and therefore excellently withstands heat and light.

In connection with the light emitting device 100, the fluorescent member 4 may undergo light diffusing treatment. The light diffusing treatment may include, for example, roughening the upper surface of the fluorescent member 4, or providing the fluorescent member 4 with a scattering layer in which filler is dispersed. Further, filler may be dispersed inside the fluorescent member 4. Thus, the laser light is scattered before becoming incident on the fluorescent member 4. Accordingly, as compared to the case where the fluorescent member 4 does not undergo the light diffusing treatment, the present embodiment reduces the directivity of reflected light. As a result, the directivity of the reflected light can approximate that of the wavelength converted light. Specifically, in the case where the reflected light is, for example, blue-color light, and the wavelength converted light is, for example, yellow-color light, the blue-color light and the yellow-color light having similar directivity can reduce variations in color of white-color light extracted to the outside of the light emitting device.

The upper surface of the fluorescent member 4 is preferably positioned to be closer to the mounting surface of the base member 1 than the light emission point of the laser element 2. This positioning facilitates the laser light becoming incident on the first main surface of the fluorescent member 4 from a point diagonally above the first main surface. The fluorescent member 4 preferably has a thickness of 0.05 mm to 0.5 mm, more preferably 0.1 mm to 0.2 mm.

The fluorescent member 4 may be, for example, rectangular parallelepiped-shaped, and may have a width (indicated by W in FIG. 1) of 1 mm or less, and a length (indicated by L in FIG. 1) of 1 mm or less. More preferably, the fluorescent member 4 may have a width of 0.5 mm or less, and a length of 0.5 mm or less. The fluorescent member 4 having dimension falling within these numerical ranges has a reduced light emission area, which can increase luminance of the light emitting device 100. Note that the smaller the light emission area of the fluorescent member 4 is, the higher the optical density of the light emission surface of the light-emitting fluorescent member 4 becomes. The higher the optical density is, the greater the amount of dust collected on the light emission surface of the fluorescent member 4 tends to become. However, with the light emitting device 100, because the fluorescent member 4 is hermetically enclosed, the possibility of collection of dust on the light emission surface of the fluorescent member 4 can be reduced. Further, the fluorescent member 4 having a width of 0.1 mm or more and a length of 0.1 mm or more reduces the possibility of the laser light missing the fluorescent member 4, coping with any possible displacement of the fluorescent member 4 on the mounting surface of the base member 1. Thus, the possibility of the laser light being directly emitted to the outside of the light emitting device 100 without becoming incident on the fluorescent member 4 can be reduced. While the fluorescent member 4 in the light emitting device 100 is substantially square as seen in a top view, it may have a shape other than a square.

In the case where the first optical member 3 is disposed between the laser element 2 and the fluorescent member 4, the laser element 2 and the fluorescent member 4, which tend to attain high temperatures relative to other members, can be spaced apart from each other. Thus, the heat releasing efficiency of both the laser element 2 and the fluorescent member 4 can be improved. Preferably, the distance between the laser element 2 and the fluorescent member 4 is from 1 mm to 5 mm inclusive. The distance of 1 mm or more can reduce heat interference from the laser element 2 and the fluorescent member 4. The distance of 5 mm or less allows the laser light to become incident on the fluorescent member 4 by a relatively short distance from the laser element 2. In this manner, not only can a reduction in use efficiency of the laser light be suppressed, but also the influence on the laser light due to displacement of the members can be reduced. Further, miniaturization of light emitting device 100 can be also achieved.

Base Member 1

As shown in FIG. 2, the base member 1 may have a first recess 1a which opens upward. In this case, the laser element 2 and the like are mounted on the bottom surface of the first recess 1a, and therefore the bottom surface of the first recess 1a becomes the mounting surface of the base member 1. Note that, as will be described later, a second recess 1b may be provided at the bottom surface of the first recess 1a. In this case, the bottom surface of the second recess 1b also becomes the mounting surface of the base member 1.

The base member 1 may be formed by, for example, ceramic such as aluminum nitride and aluminum oxide and/or metal. Preferably, the base member 1 is mainly formed by aluminum nitride for improved thermal conductivity and corrosion resistance. Further, when the base member 1 is mainly formed by ceramic having a layered structure, as shown in FIG. 3, an internal wiring 10 that electrically connects between a connecting surface 9 and an external electrode 11, which will be described later, can be embedded in the base member 1. Forming the internal wiring 10 at the base member 1 makes it possible to electrically connect between the inside and outside of the enclosed space. This eliminates the necessity of providing any lead terminals penetrating through the base member 1, and consequently facilitates establishment of hermetic enclosure. The internal wiring 10 may be formed mainly by, for example, tungsten or molybdenum.

As shown in FIG. 2, a metal part 13 to which the lid 5 is connected may be disposed on the upper surface of the base member 1. The main component of the metal part 13 may be, for example, iron or Kovar® (nickel-cobalt ferrous alloy). The surface of the metal part 13 may be Ni-plated or Au-plated. The metal part 13 is fixed to the upper surface of the base member 1 with Ag solder or the like. In the case where the base member 1 is mainly structured by ceramic, the metal part 13 being disposed on the upper surface of the base member 1 makes it easier to fix the lid 5 to the base member 1 by welding such as seam welding. This facilitates establishment of hermetic enclosure of the light emitting device 100.

The bottom surface of the first recess 1*a* serving as the mounting surface of the base member 1 is preferably flat. Further, the mounting surface of the base member 1 is preferably substantially parallel to the lower surface of the base member 1. By having a flat mounting surface of the base member 1, the heat sink that may be disposed on the lower surface of the base member 1 can exhibit higher and uniform heat releasing efficiency for the members on the mounting surface of the base member 1. The lateral surface of the first recess 1*a* of the base member 1 may be a light shielding surface. In this case, preferably the entire lateral surface of the first recess 1*a* is a light shielding surface. The entire lateral surface being a light shielding surface reduces the possibility of the laser light being extracted to the outside, coping with the situation where the laser light misses the fluorescent member 4 due to displacement of the fluorescent member 4 and travels inside the first recess 1*a*. Further, the entire lateral surface being a light shielding surface can also reduce occurrence of stray light. Note that, in the case where the lid 5 structures the lateral surface of the light emitting device 100, the lateral surface of the lid 5 is also preferably a light shielding surface. This exhibits a similar effect.

In the case where the first optical member 3 is disposed between the laser element 2 and the fluorescent member 4, as shown in FIG. 2, the base member 1 preferably has, in the first recess 1*a*, a light shielding part 12 that prevents the laser light from transmitting through the lid 5 and directly emitted to the outside. As seen in a top view, the light shielding part 12 is preferably formed so the fluorescent member 4 is fixed in between the light shielding part 12 and the laser element 2, and is preferably formed at a level higher than the upper surface of the fluorescent member 4. Further, the light shielding part 12 is preferably substantially parallel to the mounting surface of the base member 1. Thus, in the case where the laser light misses the fluorescent member 4 due to displacement of the fluorescent member 4 and travels inside the first recess 1*a*, the laser light becomes incident on the light shielding part 12 formed on the side opposite to the laser element 2. This reduces the possibility of the laser light being directly emitted to the outside of the light emitting device 100, and consequently the safety of the light emitting device 100 improves.

As shown in FIGS. 1 and 3, in the first recess 1*a*, the base member 1 preferably includes the connecting surface 9 electrically connected to the external electrode 11, which will be described later. The connecting surface 9 is preferably parallel to the mounting surface of the base member 1, and formed at a level higher than the mounting surface of the base member 1, which level is at a height similar to that of the upper surface of the laser element 2. In the light emitting device 100, the laser element 2, the submount 7, and the connecting surface 9 are connected each via four wires 8. The material of the wires 8 may be Au. When the base member 1 is mainly made of ceramic, preferably a wiring layer such as a metal film is disposed on the connecting surface 9. In this case, the wires 8 are connected to the wiring layer. The metal film may contain metal such as, for example, Au, Ag, Al, Ti, Pt, Ni, or Pd As shown in FIG. 1, the base member 1 may have the external electrode 11 for electrically connecting to the outside. The external electrode 11 is electrically connected to the connecting surface 9 with the internal wiring 10. In the light emitting device 100, as seen in a top view, the external electrode 11 and the connecting surface 9 are disposed in close proximity to each other having the inner edge of the first recess 1*a* of the base member 1 interposed between them.

The external electrode 11 may be, for example, a metal film. The metal film may contain, for example, Au, Ag, Al, Ti, Pt, Ni, or Pd. The metal film being the external electrode 11 may be made of the material identical to that of the metal film disposed on the connecting surface.

Lid 5

As shown in FIG. 2, the lid 5 is connected to the upper surface of the base member 1 so as to close the opening of the first recess 1*a*, and enclose the laser element 2, the fluorescent member 4, and the first optical member 3 inside the first recess 1*a*. The lid 5 is preferably joined to the base member 1 so as to hermetically seal the base member 1. That is, in the case where the laser element 2 is, for example, a GaN-based semiconductor laser element, the optical density is particularly high at the light exiting surface of the laser element 2 and its surrounding, and organic substances and the like tend to be collected. Here, the hermetic enclosure can effectively prevent such collecting. The hermetic enclosure also reduces any influence on the fluorescent member 4 due to external moisture. Further, for example, as compared to the case where only the laser element 2 is hermetically enclosed, hermetically enclosing each of the members in a first recess 1*a* which is a single space can achieve miniaturization of the light emitting device 100.

The lid 5 includes a light-transmissive member 5*a* that transmits light from the fluorescent member 4. The material of the light-transmissive member 5*a* is preferably similar in the coefficient of linear expansion to a retaining member 5*b*, which will be described later, so that higher airtightness of the base member 1 is attained. Specifically, the light-transmissive member 5*a* may be glass. In the light emitting device 100, the light-transmissive member 5*a* is made of borosilicate glass. Further, the light-transmissive member 5*a* preferably has its both surface provided with AR coating. This improves the transmittance of the laser light, and can suppress a reduction in light extraction efficiency. Note that, in the light emitting device 100, the light-transmissive member 5*a* does not contain any fluorescent material.

The distance between the lower surface of the lid 5 and the upper surface of the fluorescent member 4 is preferably 5 mm or less. Such a distance improves the light extraction efficiency of the light emitting device 100. That is, light from the fluorescent member 4 diverges as it is distanced from the fluorescent member 4. Therefore, the shortened distance between the lower surface of the lid 5 and the upper surface of the fluorescent member 4 reduces the possibility of the light from the fluorescent member 4 becoming incident on any member other than the light-transmissive member 5*a*, and can consequently improve light extraction efficiency.

The lid 5 preferably includes the retaining member 5*b* provided with a through hole. As shown in FIG. 1, while the through hole is circular in the light emitting device 100, the shape thereof may be specified as appropriate. As shown in FIGS. 1 and 2, the light-transmissive member 5*a* is fixed so as to close the through hole of the retaining member 5*b*.

Further, the retaining member 5b having light-shielding property except for the through hole reduces the possibility of the laser light missing the fluorescent member 4 and directly emitted to the outside of the light emitting device 100, which consequently improves safety of the light emitting device 100. In other words, as seen in a top view, the light-shielding retaining member 5b covering the entire region of the mounting surface of the base member 1 excluding the region overlapping with the through hole can suppress the laser light from being directly emitted to the outside, coping with the situation where the laser light misses the fluorescent member 4 due to displacement of the fluorescent member 4 and traveling inside the first recess 1a. Further, such a manner of the light-shielding retaining member 5b also can reduce occurrence of stray light. The retaining member 5b may be made of metal containing Kovar® (nickel-cobalt ferrous alloy) or the like, and may have its surface Ni-plated or Au-plated. The retaining member 5b and the light-transmissive member 5a may be joined to each other with low-melting-point glass, for example.

As shown in FIG. 2, the through hole of the retaining member 5b is preferably disposed at a position where the laser light regularly reflected by the first main surface of the fluorescent member 4 does not enter the through hole. That is, the light from the laser element 2 is refracted by the first optical member 3 and becomes incident on the fluorescent member 4 at a predetermined angle. Here, the through hole is preferably disposed at the position where, out of the light incident on the fluorescent member 4, the laser light regularly reflected by the first main surface of the fluorescent member 4 does not enter the through hole. Such disposition reduces the possibility of the laser light directly emitted to the outside, coping with any possible displacement of the fluorescent member 4.

In the case where the lid 5 includes the light-transmissive member 5a and the retaining member 5b, the base member 1 and the retaining member 5b can be connected to each other by welding such as seam welding. The welding strongly fixes the retaining member 5b and the base member 1 to each other, and thus provides the light emitting device 100 in which the lid 5 does not come off easily from the base member 1, and can withstand any shock such as vibrations received by the light emitting device 100.

The retaining member 5b preferably includes a recess, and connected to the upper surface of the base member 1 such that part of the recess of the retaining member 5b is positioned inside the first recess 1a of the base member 1. In this case, the through hole of the retaining member 5b is provided at the bottom surface of the recess of the retaining member 5b, and the light-transmissive member 5a is disposed in the recess of the retaining member 5b. Thus, members disposed outside the light emitting device 100 become less prone to be brought into contact with the light-transmissive member 5a, and therefore the possibility of occurrence of any damage that may be done to the light-transmissive member 5a can be reduced. Further, this can reduce the distance between the fluorescent member 4 and the light-transmissive member 5a, which increases the light from the fluorescent member 4 that transmits through the light-transmissive member 5a, thereby improving the light extraction efficiency of the fluorescent member 4.

In the light emitting device 100, the retaining member 5b is shaped to firstly extend toward the center of the base member 1 and then bend downward, followed by further bending to extend toward the center of the base member 1. Thus, the recess of the retaining member 5b is formed. The downwardly extending region of the retaining member 5b can alleviate the stress occurring from the difference in thermal expansion coefficient between the base member 1 and the retaining member 5b. Accordingly, the possibility of occurrence of plastic deformation of the retaining member 5b or any damage that may be done to the light-transmissive member 5a can be reduced.

The light emitting device 100 is substantially quadrangular as seen in a top view. Each side of the light emitting device 100 preferably has a length of 5 mm or more, and more preferably 10 mm or more, in view of heat releasing property. On the other hand, each side of the light emitting device 100 preferably has a length of 25 mm or less, and more preferably 20 mm or less, in view of miniaturization of the light emitting device 100. Further, when the base member 1 has the quadrangular first recess 1a as seen in a top view, each side of the upper edge of the recess, that is, each side of the inner edge of the upper surface of the base member 1 preferably has a length of 1 mm or more, and more preferably 2 mm or more, in view of mounting members such as laser element 2. On the other hand, each side of the inner edge of the upper surface of the base member 1 has a length of 15 mm or less, and more preferably 10 mm or less, in view of preventing an increase in size of the light emitting device 100. The thickness of the light emitting device 100 is preferably 6 mm or less. Here, the thickness of the light emitting device 100 refers to the length from the lower surface of the base member 1 to the upper surface of the lid 5.

Second Embodiment

A light emitting device 200 according to a second embodiment is different from the first embodiment in that the fluorescent member 4 is disposed in the second recess 1b formed in the first recess 1a, and the first optical member 3 is disposed above the fluorescent member 4. The rest of the structure is similar to the first embodiment.

Figure 6:
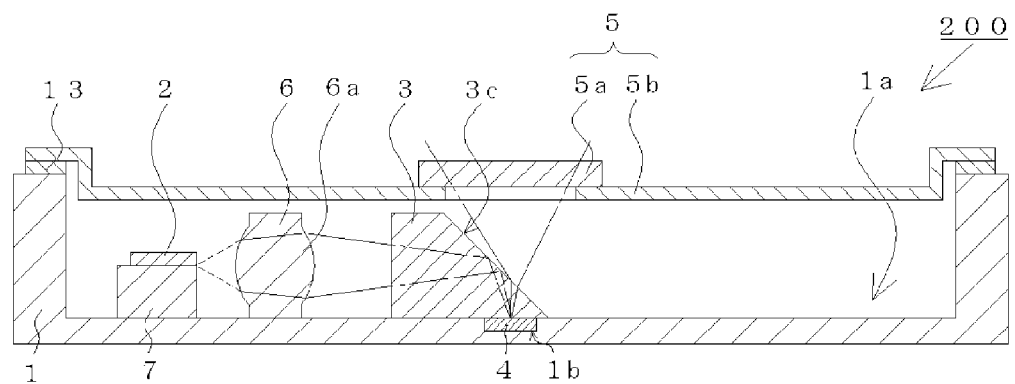
FIG. 6 is a schematic cross-sectional view of a light emitting device according to a second embodiment.

As shown in FIG. 6, in the light emitting device 200 according to the second embodiment, the fluorescent member 4 is disposed in the second recess 1b formed in the first recess 1a of the base member 1, and the first optical member 3 is disposed above the fluorescent member 4. The second optical member 6 is disposed between the first optical member 3 and the laser element 2. Here, the first optical member 3 includes the bottom surface that opposes to the mounting surface of the base member 1, and an inclined surface 3c. The bottom surface and the inclined surface 3c of the first optical member 3 form an angle that causes laser light entering the first optical member 3 to be totally reflected by the inclined surface 3c in the direction toward the first main surface of the fluorescent member 4, and to cause light from the fluorescent member 4 becoming incident on the bottom surface of the first optical member 3 to be refracted by the inclined surface 3c. Accordingly, laser light is condensed by the second optical member 6 and enters the first optical member 3. Then, the laser light is once totally reflected by the inclined surface 3c of the first optical member 3, to become incident on the first main surface of the fluorescent member 4 from the bottom surface of the first optical member 3, and excites the fluorescent member 4. Then, the excited fluorescent member 4 emits wavelength converted light mainly upward. The wavelength converted light and reflected light reflected by the fluorescent member 4 without exciting the fluorescent member 4 enter the first optical member 3 from the bottom surface thereof, and then refracted by the inclined surface 3c of the first optical member 3, to be extracted to the outside of the light emitting device 200. Note that, in the light emitting device 200, the bottom surface of the first recess 1a and the bottom surface of the second recess 1b are both flat and parallel to each other.

This structure allows laser light to become incident on the fluorescent member 4 by a nearly vertical incident angle. Therefore, with reflected light (for example, blue-color light) of a greater amount being allowed to travel upward, the light extraction efficiency of the light emitting device 200 improves. Furthermore, as compared to the case where the laser light becomes incident on the fluorescent member 4 by a nearly horizontal incident angle, the rate of laser light being reflected by the upper surface of the fluorescent member 4 reduces, and consequently the excitation efficiency of the fluorescent member 4 improves. Further, adjusting the angle formed between the bottom surface of the first optical member 3 and the inclined surface 3c of the first optical member 3 enables to adjust the angle of light exiting toward the upper surface in accordance with the design of the light emitting device 200. Thus, the light extraction efficiency improves. Specifically, the angle formed between the bottom surface of the first optical member 3 and the inclined surface 3c of the first optical member 3 is preferably 30 degrees to 40 degrees. Further, similarly to the first embodiment, the second embodiment allows laser light from the laser element 2 to become incident on the fluorescent member 4 by a short distance, thereby reducing a reduction in use efficiency of the laser light. Further, such a short distance also reduces any influence on the laser light due to displacement of the members. Further, such a short distance also contributes toward miniaturization of the light emitting device 200.

The fluorescent member 4 is disposed in the second recess 1b formed in the first recess 1a, and the first optical member 3 is disposed above the fluorescent member 4. Such disposition reduces the possibility of displacement of the fluorescent member 4 after being mounted on the mounting surface of the base member 1. The reduced possibility of displacement reduces the possibility of the laser light missing the fluorescent member 4 and exiting to the outside of the light emitting device 200. Thus, the safety of the light emitting device 200 improves. Further, the fluorescent member 4 being joined to the bottom surface and the lateral surface of the second recess 1b increases the surface area of the fluorescent member 4 joined to the base member 1, as compared to the case where the fluorescent member 4 is joined just to the mounting surface of the base member 1. This improves the heat releasing efficiency from the fluorescent member 4 to the base member 1. Note that, the fluorescent member 4 being joined to the mounting surface or the like of the base member 1 includes the case where the fluorescent member 4 is joined via an adhesive agent.

What is claimed is:

1. A light emitting device comprising:
   a base member;
   a laser element disposed on or above a mounting surface of the base member;
   a fluorescent member including a first main surface and a second main surface respectively positioned on opposite sides of the fluorescent member, the second main surface being fixed to the mounting surface of the base member;
   a first optical member configured to change a traveling direction of an optical axis of laser light emitted by the laser element to be directed toward the first main surface of the fluorescent member; and
   a lid connected to the base member and enclosing the laser element, the fluorescent member, and the first optical member in a space beneath the lid, the lid being configured to transmit light from the fluorescent member.

2. The light emitting device according to claim 1, wherein the mounting surface of the base member is flat.

3. The light emitting device according to claim 1, wherein the laser element, the first optical member, and the fluorescent member are disposed in this order along the mounting surface of the base member.

4. The light emitting device according to claim 3, wherein:
   the base member further includes a light shielding part that is spaced apart from the mounting surface of the base member, the light shielding part being configured to shield the laser light, and
   the fluorescent member is fixed to the mounting surface at a location between the light shielding part and the laser element.

5. The light emitting device according to claim 1, further comprising:
   a second optical member disposed between the laser element and the first optical member, the second optical member being configured to condense or collimate the laser light.

6. The light emitting device according to claim 1, wherein an upper surface of the first optical member is flat.

7. The light emitting device according to claim 1, further comprising:
   a light shielding film disposed on an upper surface of the first optical member.

8. The light emitting device according to claim 1, wherein the first optical member is a prism.

9. The light emitting device according to claim 8, wherein:
   the prism includes a bottom surface that opposes the mounting surface of the base member and a light exiting surface from which the laser light exits, and
   the bottom surface of the prism and the light exiting surface of the prism form an acute angle.

10. The light emitting device according to claim 9, wherein:
    the prism further includes a light entering surface from which the laser light enters, and
    an anti-reflective coating is disposed on the light entering surface and the light exiting surface of the prism.

11. The light emitting device according to claim 8,
    wherein the prism includes a light entering surface from which the laser light enters, and a light exiting surface from which the laser light exits, and
    an anti-reflective coating is disposed on the light entering surface and the light exiting surface of the prism.

12. The light emitting device according to claim 1, wherein the lid is hermetically sealed to the base member.

13. The light emitting device according to claim 1, wherein:
    the base member includes at least one lateral surface defining a recess that opens upward, and
    at least a portion of the at least one lateral surface is a light shielding surface.

14. The light emitting device according to claim 13, wherein an entirety of the at least one lateral surface is a light shielding surface.

15. The light emitting device according to claim 1, wherein the distance between a lower surface of the lid and an upper surface of the fluorescent member is 5 mm or less.

16. The light emitting device according to claim 1, wherein:
in a top view, the light emitting device is substantially quadrangular, and
a length of each side of the light emitting device is in a range of 5 mm to 20 mm.

17. The light emitting device according to claim 1, wherein a thickness of the light emitting device is 6 mm or less.

18. The light emitting device according to claim 1, further comprising:
a light shielding film disposed on an upper surface of the first optical member.

19. A light emitting device comprising:
a base member including at least one lateral surface defining a recess that opens upward, wherein at least a portion of the at least one lateral surface is a light shielding surface;
a laser element disposed on or above a mounting surface of the base member;
a fluorescent member including a first main surface and a second main surface respectively positioned on opposite sides of the fluorescent member, the second main surface being fixed to the mounting surface of the base member;
a first optical member configured to change a traveling direction of laser light emitted by the laser element to be directed toward the first main surface of the fluorescent member; and
a lid connected to the base member and enclosing the laser element, the fluorescent member, and the first optical member in a space beneath the lid, the lid being configured to transmit light from the fluorescent member.

20. The light emitting device according to claim 19, wherein the mounting surface of the base member is flat.

21. The light emitting device according to claim 19, wherein the laser element, the first optical member, and the fluorescent member are disposed in this order along the mounting surface of the base member.

22. The light emitting device according to claim 21, wherein:
the base member further includes a light shielding part that is spaced apart from the mounting surface of the base member, the light shielding part being configured to shield the laser light, and
the fluorescent member is fixed to the mounting surface at a location between the light shielding part and the laser element.

23. The light emitting device according to claim 19, further comprising:
a second optical member disposed between the laser element and the first optical member, the second optical member being configured to condense or collimate the laser light.

24. The light emitting device according to claim 19, wherein an upper surface of the first optical member is flat.

25. The light emitting device according to claim 19, wherein the first optical member is a prism.

26. The light emitting device according to claim 25, wherein:
the prism includes a bottom surface that opposes the mounting surface of the base member and a light exiting surface from which the laser light exits, and
the bottom surface of the prism and the light exiting surface of the prism form an acute angle.

27. The light emitting device according to claim 26, wherein:
the prism further includes a light entering surface from which the laser light enters, and
an anti-reflective coating is disposed on the light entering surface and the light exiting surface of the prism.

28. The light emitting device according to claim 25,
wherein the prism includes a light entering surface from which the laser light enters, and a light exiting surface from which the laser light exits, and
an anti-reflective coating is disposed on the light entering surface and the light exiting surface of the prism.

29. The light emitting device according to claim 19, wherein the lid is hermetically sealed to the base member.

30. The light emitting device according to claim 19, wherein an entirety of the at least one lateral surface is a light shielding surface.

31. A light emitting device comprising:
a base member;
a laser element disposed on or above a mounting surface of the base member;
a fluorescent member including a first main surface and a second main surface respectively positioned on opposite sides of the fluorescent member, the second main surface being fixed to the mounting surface of the base member;
a first optical member configured to change a traveling direction of laser light emitted by the laser element to be directed toward the first main surface of the fluorescent member;
a light shielding film disposed on an upper surface of the first optical member; and
a lid connected to the base member and enclosing the laser element, the fluorescent member, and the first optical member in a space beneath the lid, the lid being configured to transmit light from the fluorescent member.

* * * * *